United States Patent
Li et al.

(10) Patent No.: US 7,199,434 B2
(45) Date of Patent: Apr. 3, 2007

(54) MAGNETIC FIELD EFFECT TRANSISTOR, LATCH AND METHOD

(75) Inventors: Zhiqing Li, Singapore (SG); Xiaowei Sun, Singapore (SG); Ping Shum, Singapore (SG)

(73) Assignee: Nanyang Technological University, Singapore (SG)

( * ) Notice: Subject to any disclaimer, the term of this patent is extended or adjusted under 35 U.S.C. 154(b) by 110 days.

(21) Appl. No.: 10/729,859

(22) Filed: Dec. 5, 2003

(65) Prior Publication Data

US 2005/0121700 A1 Jun. 9, 2005

(51) Int. Cl.
*H01L 29/82* (2006.01)

(52) U.S. Cl. .................. 257/421; 257/252; 257/366; 257/E29.323

(58) Field of Classification Search ........ 257/421–430, 257/252, 366; 324/200
See application file for complete search history.

(56) References Cited

U.S. PATENT DOCUMENTS

| | | | |
|---|---|---|---|
| 3,714,523 A * | 1/1973 | Bate | ............................ 257/252 |
| 5,083,174 A * | 1/1992 | Kub | ............................ 257/421 |
| 5,208,477 A | 5/1993 | Kub | |
| 5,438,990 A | 8/1995 | Wahlstrand et al. | |
| 5,489,846 A | 2/1996 | Li et al. | |
| 5,920,090 A * | 7/1999 | Stenberg | ..................... 257/252 |

OTHER PUBLICATIONS

Li; A CMOS magnetic latch with extremely high resolution; Dec. 8-11, 2002; Electron Devices Meeting, 2002. IEDM '02. Digest International; pp. 909-912.*
Sun; Weak magnetic field pattern detection by CMOS magnetic latch; Electron Device Letters, IEEE; vol. 24, issue 10; Oct. 2003; Posted online Sep. 29, 2003; pp. 652-654.*
Ghandhi; VLSI fabrication principles: silicon and gallium arsenide; 2nd. ed.; 1994; John Wiley & Sons, Inc., New York; pp. 731.*
Stefan Rohrer et al., "A MAGFET Sensor Array for Digital Magnetic Signal Reading", IEEE, 1997, p. 308-310.
F.J. Kub et al., "Multiple-Gate Split-Drain MOSFET Magnetic-Field Sensing Device and Amplifier", IEDM 1992, p. 517-20.
Li, Z. et al., "A CMOS Magnetic Latch with Extremely High Resolution", IEDM 2002, Tech. Digest, pp. 909-912.
Li, Z. et al., "Weak Magnetic Field Pattern Detection by CMOS Magnetic Latch", IEEE, 2003.

* cited by examiner

*Primary Examiner*—Marcos D. Pizarro
(74) *Attorney, Agent, or Firm*—Dinsmore & Shohl LLP

(57) ABSTRACT

A split drain magnetic field effect transistor (MAGFET) includes at least one supplemental gate to exert a lateral electrical field in the channel of the MAGFET. Connection of the supplemental gate in feedback with one of the two drain contacts allows the MAGFET to act as a latch sensitive to the presence of an external magnetic field. Preferably, the MAGFET includes two laterally spaced supplemental gates, allowing for the detection of an external magnetic field and its orientation.

7 Claims, 5 Drawing Sheets

MAGNETIC FIELD EFFECT TRANSISTOR, LATCH AND METHOD

FIELD OF THE INVENTION

The present invention relates generally to magnetic field detection, and more particularly to a magnetic field effect transistor, latch and methods.

BACKGROUND OF THE INVENTION

Many electronic applications require the detection of a magnetic field. Dual drain magnetic field effect transistors (MAGFETs) are known, and are very effective for determining the strength of a magnetic field. In some cases, MAGFETs are also used to detect the absence and presence of a magnetic field. However, because of the sensitivity of a conventional MAGFET there is a limit on the smallest detectable magnetic field.

Although the sensitivity of the MAGFET can be increased by introducing multiple gates to generate a longitudinal potential gradient along the channel, as for example detailed in F. J. Kub and S. S. Scott, Multiple-gate split-drain MOSFET magnetic-field sensing device and amplifier, *IEDM Technical Digest.*, IEEE, New York, 1992, pp. 517–520, such modifications typically lead to substrate bias. Furthermore, due to velocity saturation, the improvement of the sensitivity by this approach is limited.

Accordingly, there is a need for a more sensitive magnetic field detector and method.

SUMMARY OF THE INVENTION

A split drain MAGFET includes at least one supplemental gate to exert a lateral electrical field in the channel of the MAGFET. Connection of the supplemental gate in feedback with one of the two drain contacts allows the MAGFET to act as a latch sensitive to the presence of an external magnetic field. Preferably, the MAGFET includes two laterally spaced supplemental gates, allowing for the detection of an external magnetic field and its orientation.

In accordance with an aspect of the present invention, there is provided a field effect transistor for detecting a magnetic field. The field effect transistor includes a doped layer; doped source and drain regions formed in the doped layer; first and second drain contacts spaced laterally relative to the length of the channel interconnected with the drain region. The doped layer defines a lengthwise extending channel between the source and drain regions. A gate proximate the channel controls current that may flow from the source to the drain region. Additional first and second supplemental gates are spaced laterally relative to the length of the channel. The first and second supplemental gates are electrically isolated from each other and the gate. Thus, a potential difference between the first and second supplemental gates exerts a lateral electric field in the channel.

In accordance with another aspect of the present invention, there is provided a method of detecting a magnetic field in a split drain field effect transistor including a source region, a channel interconnecting the source region to a drain region, and first and second drain contacts for guiding current from laterally spaced portions of the channel. The method includes applying a controlled electric field laterally across the channel in a direction parallel to the force experienced by electrons in the channel under the influence of a magnetic field.

In accordance with yet another aspect of the present invention, a field effect transistor includes a semiconductor substrate; a source region and a drain region; a channel formed in the substrate for guiding current from the source region to the drain region along a lengthwise extent of the channel; a gate in proximity with the channel for controlling current from the source to the drain. The drain region includes first and second drain contacts, each of which guides current from a lateral portion of the channel. The first and second supplemental gates are proximate the channel for establishing an electric field in the channel, in a direction perpendicular to the lengthwise extent.

Transistors exemplary of embodiments of the present invention may be interconnected to act as magnetic latches, whose state is controlled by the present of a magnetic field. Such latches may be used as switches or memory elements.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures which illustrate by way of example only, embodiments of the present invention.

DETAILED DESCRIPTION

Figure 1:
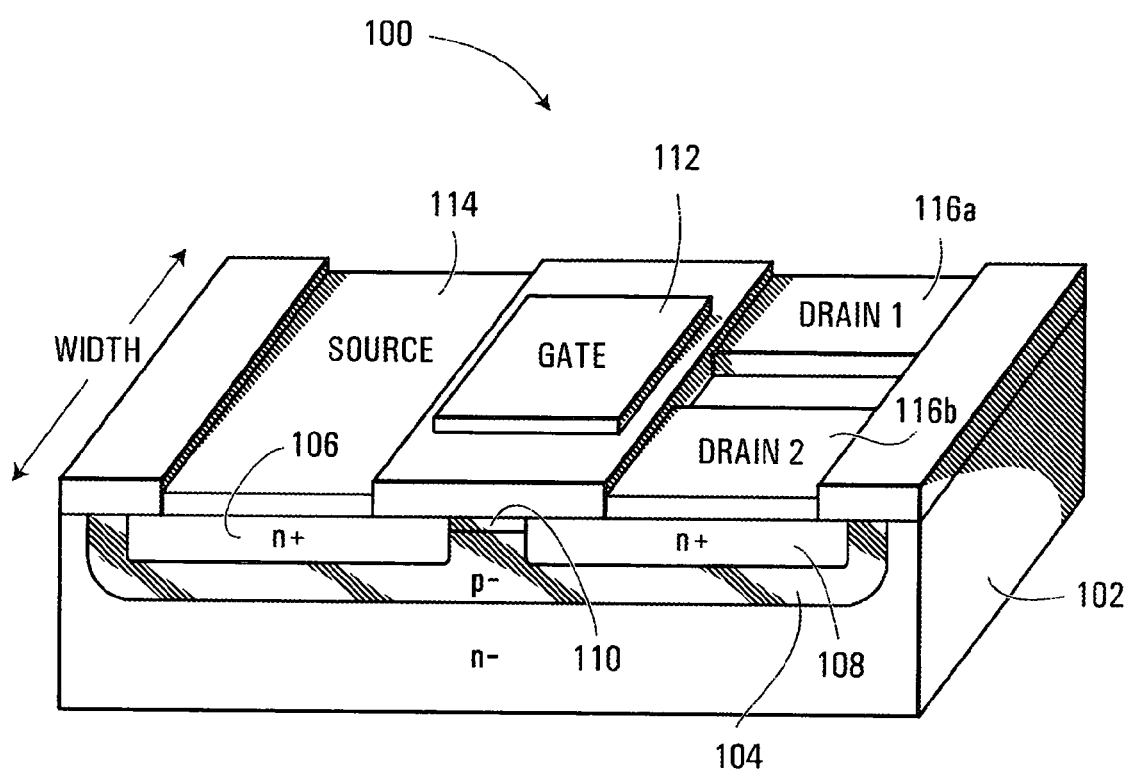
FIG. 1 is a perspective cross-sectional view of a conventional MAGFET.

FIG. 1 illustrates a convention n-channel split drain magnetic field effect transistor ("MAGFET") 100. As illustrated, MAGFET 100 includes a p-type semiconductor layer 104 configured as a well within a semiconductor substrate 102. Formed within layer 104 are n-type source and drain regions 106 and 108. The p-type semiconductor layer 104 extending between source and drain regions 106 and 108 defines a lengthwise extending channel 110. A conductive gate 112 is formed above channel 110. A metal contact 114 is formed atop source 106. Two laterally conductive contacts 116a and 116b are formed above drain region 108. As illustrated, contacts 116a and 116b are spaced laterally along the width of channel 110.

As will be appreciated substrate 102 could be eliminated and layer 104 could act as a p-type substrate for a suitable MAGFET.

Now, in the absence of an external magnetic field, MAGFET 100 functions in much the same way as a conventional field effect transistor. A voltage applied to gate 102 modulates the depth of channel 110 and thereby controls the amount of current that may flow between source region 106 and drain region 108, $I_{SD}$. Current through drain region 106, is split evenly between contacts 116a and 116b with $0.5I_{SD}=I_{Da}=I_{Db}$ flowing through each of contacts 116a and 116b.

In the presence of a magnetic field, electrons passing between source and drain along a lengthwise extent of channel 110 experience a Lorentz force perpendicular to the direction of travel of the electrons and the magnetic field. If the magnetic field includes a component perpendicular to the width and length of channel 110 (i.e. in the vertical direction), current along the length of channel 110 is laterally redistributed, with more current flowing in one lateral half of the channel than the other. The resulting current, through drains contacts 116a and 116b may be expressed as $I_{Da}=0.5(I_{SD}+i)$ for contact 116a, and $I_{Db}=0.5(I_{SD}-i)$ for contact 116b. The magnitude of the difference between $I_{Da}$ and $I_{Db}$ is attributable to the external magnetic field and may be used to assess the magnitude of the external magnetic field. Several variations to the basic MAGFET structure are known. Example MAGFETs are more particularly detailed in Henry P. Baltes and Radivoje S. Popovic, Integrated Semiconductor Magnetic Field Sensors, Proceedings of IEEE, vol. 74, pp. 1107–1132, 1986.

Figure 2:
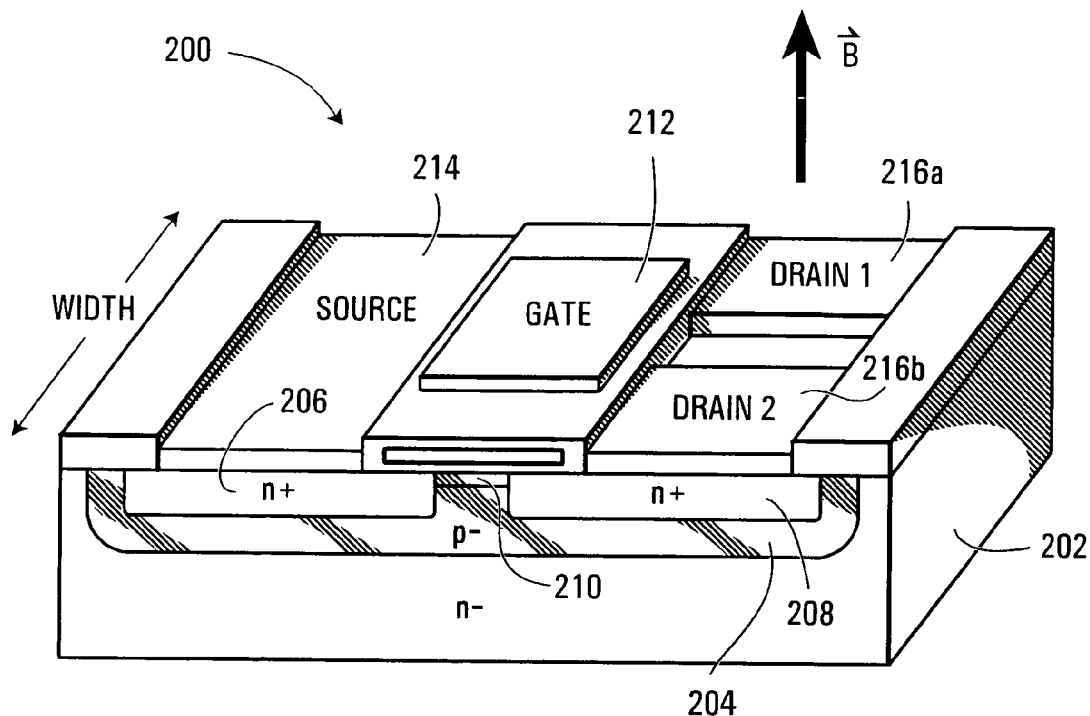
FIG. 2 is a perspective cross-sectional view of a MAGFET, exemplary of an embodiment of the present invention.
Figure 3:
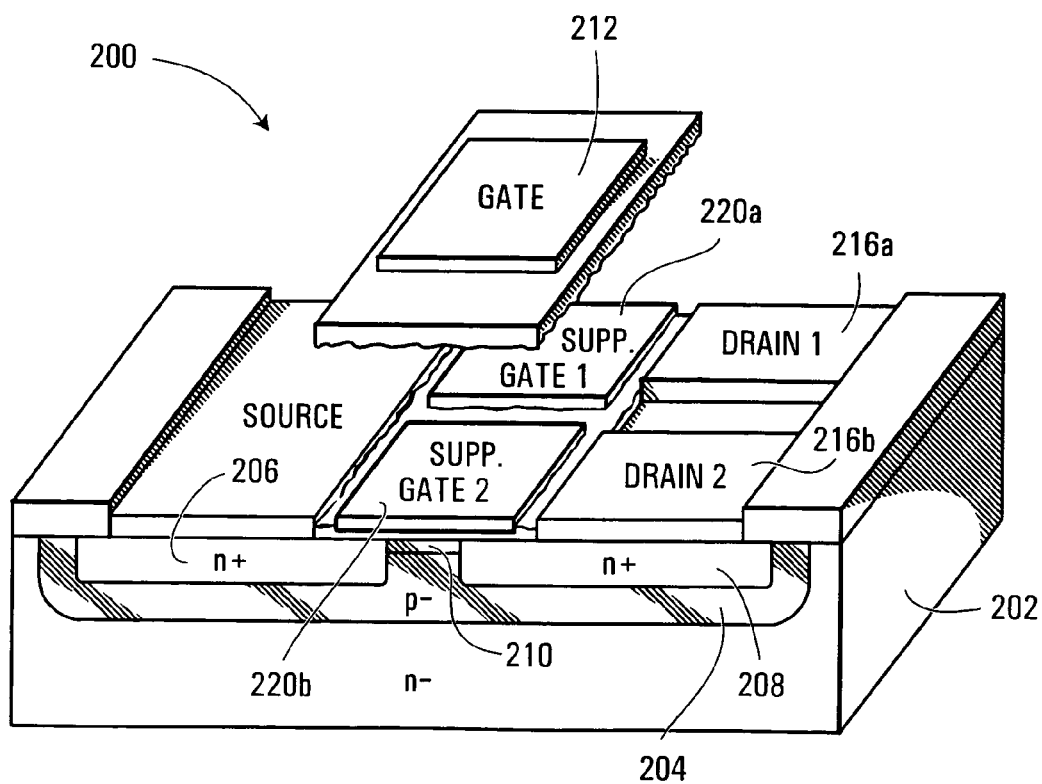
FIG. 3 is a partially exploded view of the MAGFET of FIG. 2.
Figure 4:
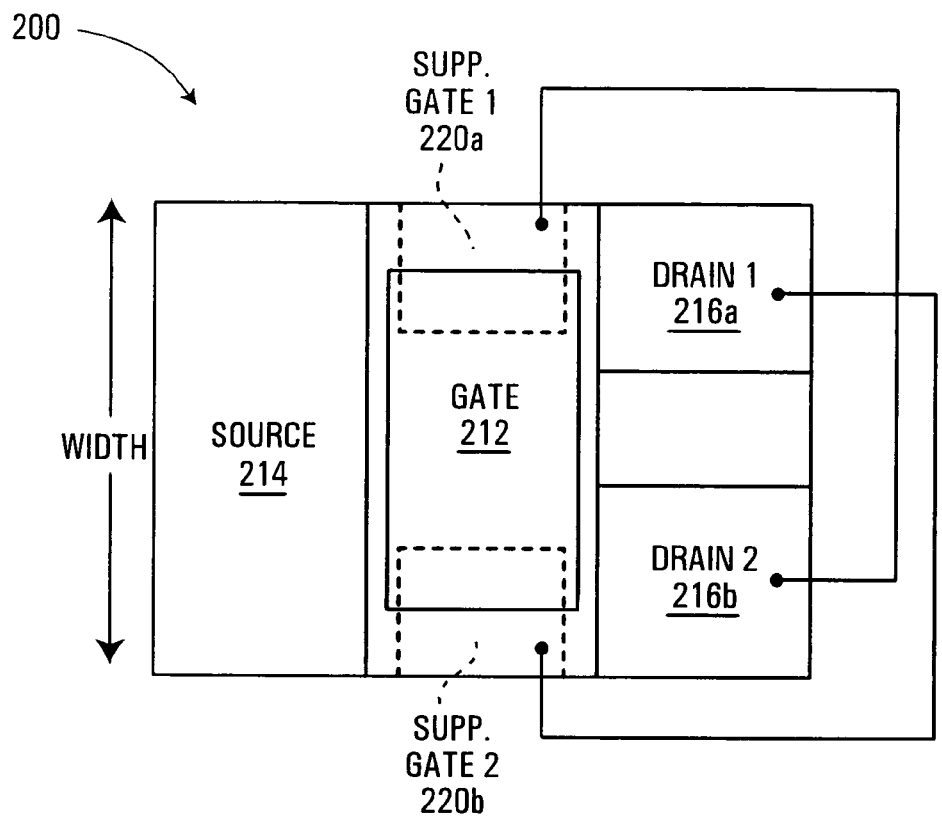
FIG. 4 is a top plan view of the MAGFET of FIG. 2 interconnected as a latch.

FIGS. 2–4 illustrate a MAGFET 200, exemplary of an embodiment of the present invention. MAGFET 200 may be fabricated using conventional CMOS fabrication techniques, allowing formation of CMOS with double conductive layers. Again, MAGFET 200 includes a p-type semiconductor layer 204 that may be formed as on an n-type semi-conductor substrate 202. Alternatively, MAGFET 200 could be formed directly on layer 204 acting as a substrate. Formed within layer 204 are n-type source and drain regions 206 and 208. Channel 210 extends lengthwise between source and drain 206 and 208. Conductive gate 212 is formed above channel 210. Two additional supplemental gates 220a and 220b are formed above channel 210 in overlapping relationship with gate 212. The two supplemental gates 220a and 220b are electrically isolated from each other and gate 212. In the exemplary MAGFET 200, supplemental gates 220a and 220b are formed in a poly-silicon layer underlying the poly-silicon layer of the conventional gate 212. Again, conductive contact 214 is formed atop source 206. Two laterally spaced conductive contacts 216a and 216b are formed atop drain region 208.

Supplemental gates 220a and 220b, like contacts 216a and 216b, are spaced along the width of channel 210. Supplemental gate 220a and contact 216a are formed proximate the rear lateral half of channel 210. Supplemental gate 220b and contact 216b are formed proximate the front lateral half of channel 210. For ease of illustration, FIG. 4 illustrates the MAGFET 200 in top plan view, with supplemental gates 220a and 220b shown in phantom. In the absence of an external magnetic field, a voltage applied to gate 212 modulates the depth of channel 210 and thereby controls the amount of current that may flow between source region 206 and drain region 208, $I_{SD}$. Additional gates 220a and 220b serve much the same purpose as gate 212. However, as these supplemental gates 220a and 220b only extend over a portion of the width of channel 210, each one only modulates the depth of a width-wise extending portion/region of the channel. That is, a voltage applied to supplemental gate 220b modulates the depth of the front portion of the width of channel 210. Similarly, a voltage applied to supplemental gate 220a modulates the depth of the rear portion of the width of channel 210. With a potential difference between gates 220a and 220b a width-wise lateral electric field is produced in channel 210.

As such, again, in the absence of a magnetic field, the amount of current flowing between source region 206 and drain region 208 may be controlled by the potentials applied to gate 212, 220a, and 220b. Currents through drain region 208 will only be split evenly between contacts 216a and 216b if the potential applied to supplemental gates 220a and 220b are equal. When a voltage is applied across the two supplemental gates 220a and 220b, a potential will be developed beneath the respective gates and a lateral electric field will be formed in channel 210.

As a consequence the distribution of source to drain current exiting each drain contact 216a and 216b may be controlled by the potential difference between supplemental gates 220a and 220b.

Now, in order to provide a magnetic sensor that is highly sensitive to an external magnetic field in the vertical direction, MAGFET 200 may be connected as a latch by connecting gates 220a and 220b in feedback to drain contacts 216a and 216b, as illustrated in FIG. 4. Under a load (which may be passive, active or even a p-channel MAGFET counterpart) the current imbalance in the two drain contacts 216a and 216b also results in a voltage difference across the two drain contacts 216a and 216b and across the two supplemental gates 220a and 220b. Specifically, the current imbalance through contacts 216a and 216b applies a controlled electric field, laterally across the channel in a direction parallel to the Lorentz force experienced by electrons in the channel under the influence of a magnetic field. As a result, the state of MAGFET 200 connected as a latch is determined by the applied magnetic field.

Because the rear drain contact 216a is interconnected with the front supplemental gate 220b, and the front drain contact 216b is interconnected with rear supplemental gate 220a, any imbalance in current through contact 216a or 216b will effectively be amplified: more current through contact 216a exerts a voltage on the supplemental gate controlling the lateral potential of that portion of the channel 210 associated with drain contact 216b, and generating a lateral field toward the portion of the channel associated with contact 216a, causing a further increase in current through contact 216a. The positive feedback repeats until the voltage difference between the two drain contacts 216a and 216b reaches the positive or negative maximum value allowed by the circuit construction.

Conveniently, then, MAGFET 200 acts as a latch, magnifying any current imbalance between drain contact 216a and 216b. Thus, even in the presence of a small magnetic field having a component direction perpendicular (i.e. along the depth of) channel 210, a large current imbalance between contacts 216a and 216b will be produced, allowing MAGFET 200 to be used to detect minute magnetic fields, having a component in the vertical direction. The latch, however, has only two equilibrium states. Owing to the positive feedback, the latch is highly sensitive to the presence and orientation of a magnetic field, and thus, can be used to recognize the magnetic field pattern with the two polarities.

Optionally, once MAGFET 200 is latched, the latch may be reset, as detailed below.

Figure 5:
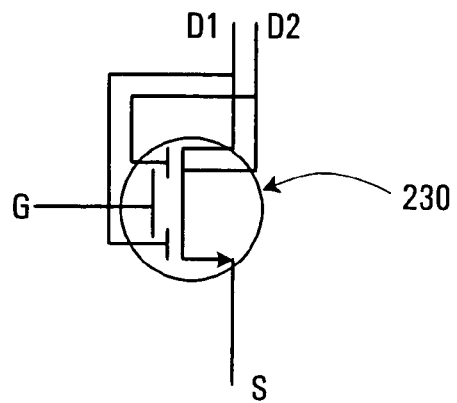
FIG. 5 is a schematic symbol of the MAGFET of FIG. 2 interconnected as a latch.

FIG. 5 schematically illustrates the MAGFET 200 of FIG. 2, using a schematic symbol 230. As illustrated, schematic symbol 230 is formed from the schematic symbol for a conventional MAGFET (such as MAGFET 100 of FIG. 1), but modified slightly to illustrate the supplemental gates 220a and 220b, and their feedback interconnection to drain contacts 216b and 216a.

Figure 7:
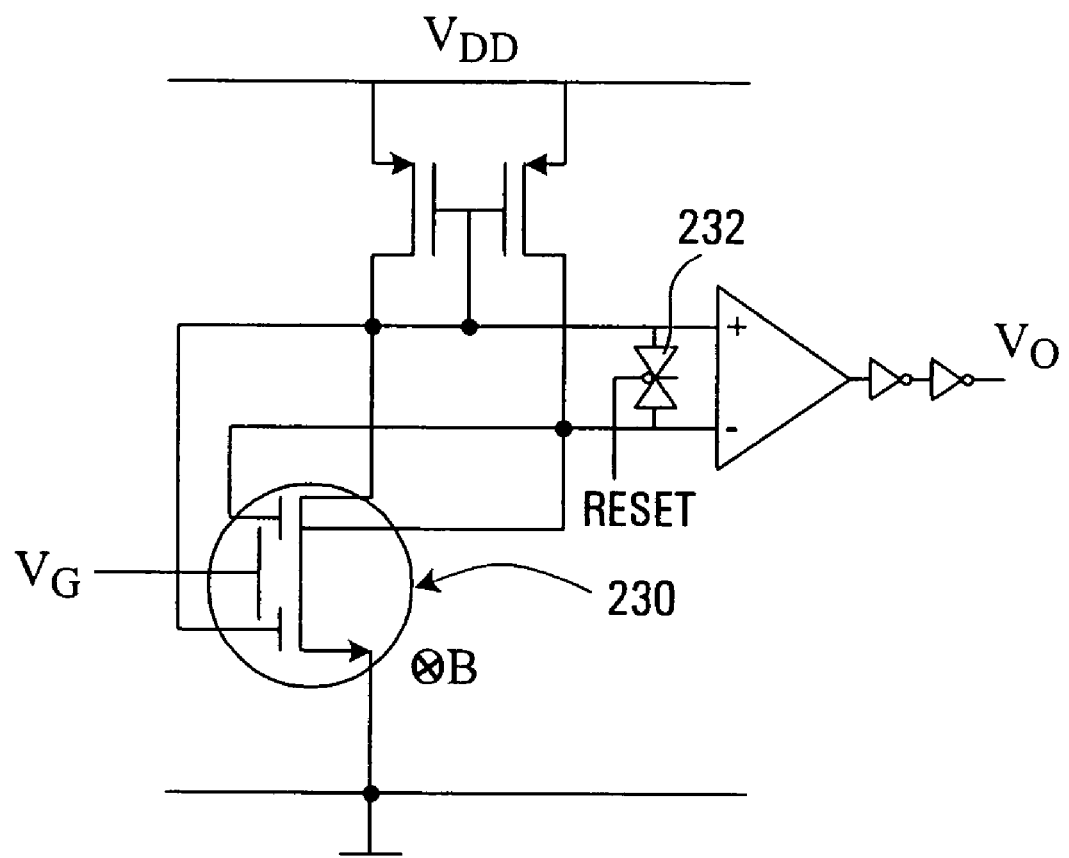
FIG. 7 is a schematic diagram of a device for detecting a magnetic field including the MAGFET of FIG. 2.

FIG. 7 illustrates a device including MAGFET 200 and a suitable clock circuit that may be used to reset a latched MAGFET 200 (as depicted using symbol 230) by temporarily shorting supplemental gates 220a and 220b by switch 232.

Figure 6:
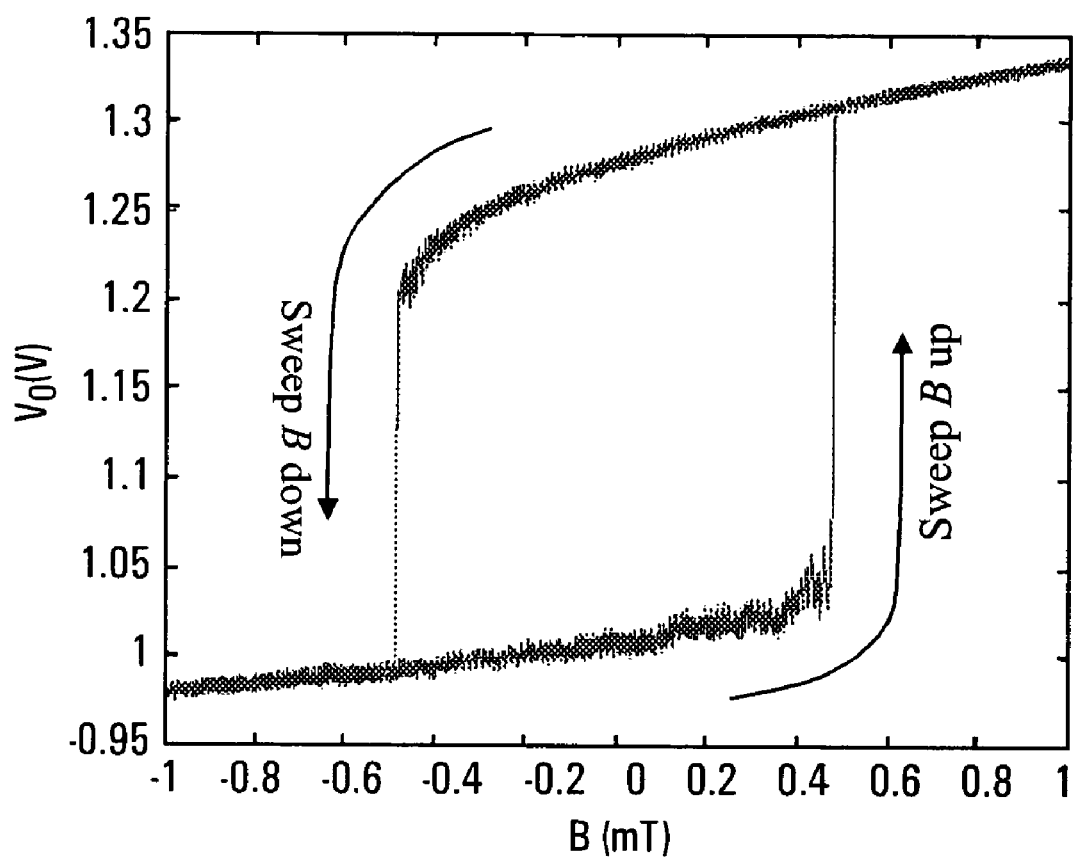
FIG. 6 is a diagram illustrating drain voltage of the magnetic field effect transistor of FIG. 2 in the presence of a magnetic field.

The magnetic response of an example MAGFET 200 with drain contacts 216a and 216b loaded with a pair of p channel MOSFETS is depicted in FIG. 6. In the depicted arrangement, when the magnetic field is crosses a threshold of about 0.5 mT MAGFET 200 transitions between high and low voltage levels. However, this threshold is dependent on the particular geometry, interconnection, etc. of MAGFET 200. When the sensor is exposed under the magnetic field strength at the turning point (B=0 for offset=0) the output state is arbitrary.

As will now be appreciated, supplemental gates 220a and 220b could be internally cross-connected in MAGFET 200 to form a latch or alternatively externally cross-connected. The response and sensitivity of a latch including MAGFET 200 could be controlled by interposing an amplifier between the two supplemental gates by amplifying the forward feedback effect. Also, the shape of the hysteresis can be modified by the aspect ratio of the channel and gate (i.e., the width/length of the channel 210, the dimension of the supplemental gates 220a, 220b), the load of the latch (resistor, p-channel MOSFET pair etc.) and other parameters in the circuit configuration (using the magnetic latch to form any functional circuit) to suit particular applications. The turning point (the switching B field) can similarly be adjusted by the above parameters to cater a switching function.

Similarly, although an n-channel MAGFET 200 has been illustrated, MAGFET 200 could easily be formed as a p-channel MAGFET.

As a further alternative, supplemental gates 220a and 220b could be located vertically above gate 212. The resulting MAGFET may be slightly less sensitive as the voltage at the gate layer farther from the channel 210, attributable to the magnetic field, will exert a lesser lateral field in the channel.

As will now be appreciated, supplemental gates 220a and 220b need only be suitably arranged relative to each other and in proximity to channel 210. Thus MAGFET 200 could be modified to include supplemental gates beneath channel 210, at the sides of channel 210 or elsewhere.

A person of ordinary skill, will now appreciate numerous applications for MAGFET 200 configured as a magnetic latch. Such a magnetic latch may, for example, be configured as a transistor switch. Gate 220 may be biased so that channel 210 conducts. In such a configuration, source to drain current through one of drain contacts 216a and 216b will be switched on allowing control of another electronic circuit. Similarly, such a magnetic latch may be used as a magnetic memory element. States of the memory element may be altered through an external magnetic field, and sensed electrically at one of drain contacts 216a and 216b. Multiple latches may be configured as a memory bank, with each latch storing a unit of binary information.

Of course, the above described embodiments are intended to be illustrative only and in no way limiting. The described embodiments of carrying out the invention are susceptible to many modifications of form, arrangement of parts, details and order of operation. The invention, rather, is intended to encompass all such modification within its scope, as defined by the claims.

What is claimed is:

1. A field effect transistor for detecting a magnetic field comprising:
 a doped layer;
 doped source and drain regions formed in said doped layer, said doped layer defining a lengthwise extending channel between said source and drain regions;
 first and second drain contacts spaced laterally relative to the length of said channel located laterally proximate first and second lateral regions of said channel, respectively, and interconnected with said drain region;
 a gate proximate said channel, for controlling current that may flow from said source to said drain region; and
 first and second supplemental gates, electrically isolated from each other and said gate and located laterally proximate said first and second lateral regions and said channel, respectively,
 wherein said first supplemental gate is interconnected with said second drain contact, and said second supplemental gate is interconnected with said first drain contact, so that said first and second supplemental gates exert a lateral electric field in said channel as a result of imbalanced current flow through said first and second drain contacts.

2. The device of claim 1, wherein said doped layer is formed of p-type semiconductor material, and said source and drain regions are formed of n-type semiconductor material.

3. The device of claim 1, wherein said doped layer is formed of n-type semiconductor material, and said source and drain regions are formed of p-type semiconductor material.

4. A magnetic latch for detecting an external magnetic field comprising the field effect transistor of claim 1, further comprising a reset switch connected between said first supplemental gate and said second supplemental gate, to short said first supplemental gate and said second supplemental gates to reset said latch.

5. The magnetic latch of claim 4, wherein said source and said first drain contact are interconnected to an electronic circuit, to switch current through said first drain contact to said electronic circuit in the presence of a magnetic field.

6. A magnetic memory element for storing a unit of binary information, comprising the magnetic latch of claim 4.

7. A field effect transistor comprising:
 a semiconductor substrate;
 a source region and a drain region;
 a channel formed in said substrate for guiding current from said source region to said drain region along a lengthwise extent of said channel;
 a gate in proximity with said channel for controlling current from said source to said drain;
 said drain region comprising first and second drain contacts, each of said first and second drain contacts for guiding current from a lateral portion of said channel;
 first and second supplemental gates proximate said channel for establishing an electric field in said channel, in a direction perpendicular to said lengthwise extents;
 wherein said first drain contact and said first supplemental gate are located proximate a first lateral region of said channel, and said second drain contact and said second supplemental gate are located proximate a second lateral region of said channel, and said first supplemental gate is electrically interconnected with said second drain contact, and second supplemental gate is electrically interconnected with said first drain contact.

* * * * *